(12) United States Patent
Chen et al.

(10) Patent No.: US 10,604,844 B2
(45) Date of Patent: Mar. 31, 2020

(54) GRAPHENE PRODUCTION USING PLASMA-ENHANCED CHEMICAL VAPOR DEPOSITION

(71) Applicant: Purdue Research Foundation, West Lafayette, IN (US)

(72) Inventors: Zhihong Chen, West Lafayette, IN (US); Shengjiao Zhang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/979,309

(22) Filed: May 14, 2018

(65) Prior Publication Data
US 2019/0345609 A1 Nov. 14, 2019

(51) Int. Cl.
| | |
|---|---|
| *C23C 16/50* | (2006.01) |
| *H01L 21/02* | (2006.01) |
| *H01L 21/285* | (2006.01) |
| *H01L 21/3213* | (2006.01) |
| *C23C 16/26* | (2006.01) |
| *C23C 16/56* | (2006.01) |

(Continued)

(52) U.S. Cl.
CPC .............. *C23C 16/50* (2013.01); *C23C 14/18* (2013.01); *C23C 14/20* (2013.01); *C23C 14/30* (2013.01); *C23C 14/34* (2013.01); *C23C 14/5806* (2013.01); *C23C 16/26* (2013.01); *C23C 16/56* (2013.01); *C23F 1/14* (2013.01); *H01L 21/0262* (2013.01); *H01L 21/02491* (2013.01); *H01L 21/02527* (2013.01); *H01L 21/28568* (2013.01); *H01L 21/32136* (2013.01); *H01L 21/0242* (2013.01); *H01L 21/02422* (2013.01)

(58) Field of Classification Search
None
See application file for complete search history.

(56) References Cited

U.S. PATENT DOCUMENTS

| 8,884,310 B2 * | 11/2014 | Seacrist | ................. H01L 21/283 257/77 |
| 9,029,228 B2 * | 5/2015 | Seacrist | ............ H01L 21/02458 257/643 |

(Continued)

OTHER PUBLICATIONS

Li et al., "Low-Temperature Growth of Graphene by Chemical Vapor Deposition Using Solid and Liquid Carbon Sources", ACS Nano, vol. 5, No. 4, 2011, pp. 3385-3390.

(Continued)

*Primary Examiner* — Allan W. Olsen
(74) *Attorney, Agent, or Firm* — Piroozi-IP, LLC

(57) ABSTRACT

A method of growing graphene at low temperature on a substrate. The method includes placing a substrate with a layer of cobalt deposited thereon in a plasma enhanced chemical vapor deposition (PECVD) chamber, providing a carbon precursor gas to the PECVD chamber, generating plasma at between about 350° C. and about 800° C. to decompose the carbon precursor gas to thereby deposit carbon atoms on the cobalt layer and enabling a plurality of the carbon atoms to diffuse through the cobalt layer thereby growing graphene on top of the cobalt layer and in between the substrate and the cobalt layer, removing carbon atoms from top of the cobalt layer, and removing the cobalt layer.

16 Claims, 12 Drawing Sheets

(51) Int. Cl.
*C23F 1/14* (2006.01)
*C23C 14/18* (2006.01)
*C23C 14/20* (2006.01)
*C23C 14/58* (2006.01)
*C23C 14/34* (2006.01)
*C23C 14/30* (2006.01)

(56) References Cited

U.S. PATENT DOCUMENTS

| | | | |
|---|---|---|---|
| 9,343,533 B2* | 5/2016 | Seacrist | H01L 21/283 |
| 9,355,842 B2* | 5/2016 | Seacrist | H01L 21/02458 |
| 9,543,156 B1 | 1/2017 | Hu | |
| 2009/0017619 A1 | 1/2009 | Lee et al. | |
| 2013/0099195 A1* | 4/2013 | Seacrist | H01L 21/283 |
| | | | 257/9 |
| 2013/0240830 A1* | 9/2013 | Seacrist | H01L 21/02458 |
| | | | 257/9 |
| 2014/0120270 A1* | 5/2014 | Tour | C23C 16/26 |
| | | | 427/596 |
| 2014/0170483 A1 | 6/2014 | Zhang et al. | |
| 2014/0255621 A1 | 9/2014 | Sinton et al. | |
| 2014/0261998 A1* | 9/2014 | Veerasamy | B82Y 30/00 |
| | | | 156/247 |
| 2014/0287155 A1* | 9/2014 | Matsumoto | B01J 23/75 |
| | | | 427/535 |
| 2014/0308523 A1* | 10/2014 | Veerasamy | B82Y 30/00 |
| | | | 428/408 |
| 2014/0374960 A1* | 12/2014 | Cojocaru | C01B 32/184 |
| | | | 264/430 |
| 2015/0021554 A1* | 1/2015 | Seacrist | H01L 21/283 |
| | | | 257/29 |
| 2015/0144881 A1* | 5/2015 | Seacrist | H01L 21/02458 |
| | | | 257/26 |
| 2015/0206748 A1* | 7/2015 | Sumant | H01L 21/02376 |
| | | | 438/481 |
| 2015/0214303 A1* | 7/2015 | Ruhl | H01L 29/1606 |
| | | | 257/29 |
| 2016/0030975 A1 | 2/2016 | Byron et al. | |
| 2016/0102402 A1 | 4/2016 | Sinton et al. | |
| 2016/0233305 A1* | 8/2016 | Seacrist | H01L 21/283 |
| 2017/0016116 A1* | 1/2017 | Nishide | C23C 14/025 |
| 2017/0051399 A1* | 2/2017 | Veerasamy | C23C 14/221 |
| 2017/0186508 A1 | 6/2017 | Lin | |
| 2018/0315599 A1* | 11/2018 | Berry | H01L 29/1606 |

OTHER PUBLICATIONS

Kwak et al., "Near room-temperature synthesis of transfer-free graphene films", Nature Communications, ncomms1650, 2012, pp. 1-7.

Lee et al., "Synthesis of conducting transparent few-layer graphene directly on glass at 450 C", Nanotechnology, 2012, pp. 1-6.

* cited by examiner

GRAPHENE PRODUCTION USING PLASMA-ENHANCED CHEMICAL VAPOR DEPOSITION

CROSS-REFERENCE TO RELATED APPLICATIONS

The present disclosure stands alone.

STATEMENT REGARDING GOVERNMENT FUNDING

This invention was not made with government support.

TECHNICAL FIELD

The present disclosure generally relates to graphene production, and in particular, to graphene production utilizing plasma-enhanced chemical vapor deposition (PECVD).

BACKGROUND

This section introduces aspects that may help facilitate a better understanding of the disclosure. Accordingly, these statements are to be read in this light and are not to be understood as admissions about what is or is not prior art.

Graphene represents a thin layer of carbon made up of atomically arranged hexagonal lattice. Owing to its structure, it can efficiently conduct heat, electrical current, and it can be made to be translucent or nearly transparent, making it a desirable material for many applications including electronic applications and optoelectronic applications.

However, there remains issues with commercial production of graphene. This is particularly problematic when there is a need for a large area graphene film. One scalable process is based on chemical vapor deposition (CVD) which is a process in which a carbon-containing precursor gas is decomposed at relatively high temperatures into various reactive carbon species, which can then be deposited on a substrate in order to grow a film of graphene. In a typical graphene deposition CVD process, the precursor gas is heated to about 1000° C. to allow for the decomposition of the precursor gas. Such high temperatures are not practical for a variety of substrates. For example, copper has been used as a substrate, with a melting point (1061° C.) just above the CVD temperature. However, such temperatures are wholly unsuitable for a variety of other desirable substrates. A limiting issue with CVD is that only catalyst substrate can be used for graphene growth, since the catalyst substrate plays a role in carbon precursor decomposition, thereby limiting choices for such substrates.

While others have used plasma-enhanced CVD (PECVD) to lower deposition temperature, the lattice structure of graphene that is grown or deposited has not been optimized for specific applications.

Therefore, there is an unmet need for a novel approach to deposit or grow graphene with controllable lattice sizes on various substrates at low temperatures.

SUMMARY

A method of growing graphene at a low temperature on a substrate is disclosed. The method includes placing a substrate with a layer of cobalt deposited thereon in a plasma enhanced chemical vapor deposition (PECVD) chamber, providing a carbon precursor gas to the PECVD chamber, generating plasma at between about 350° C. and about 800° C. to decompose the carbon precursor gas to thereby deposit carbon atoms on the cobalt layer and enabling a plurality of the carbon atoms to diffuse through the cobalt layer thereby growing graphene on top of the cobalt layer and in between the substrate and the cobalt layer, removing carbon atoms from top of the cobalt layer, and removing the cobalt layer.

DETAILED DESCRIPTION

Figure 1:
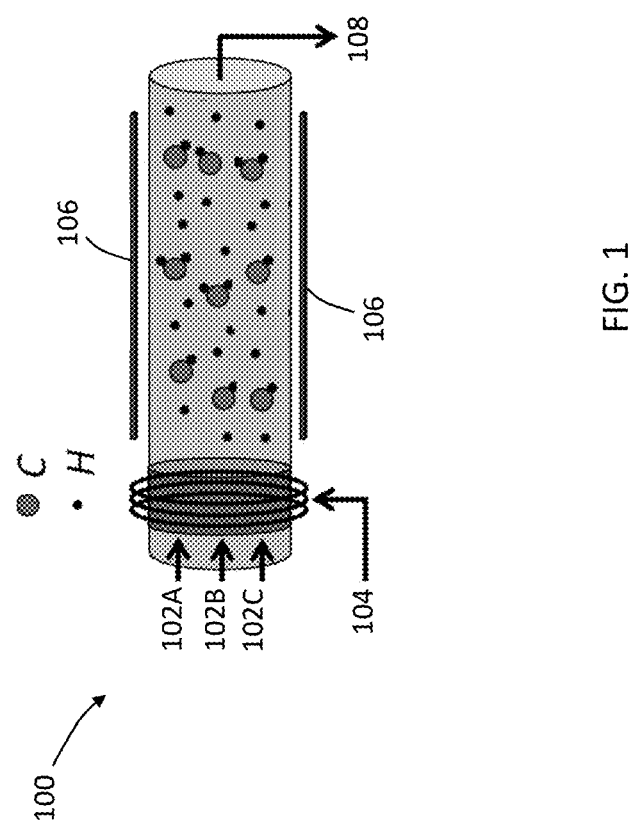
FIG. 1 is a schematic of a plasma-enhanced chemical vapor deposition (PECVD) chamber according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach including plasma-enhanced chemical vapor deposition is provided that can be used to deposit graphene on a variety of different substrates at relatively low temperatures. Referring to FIG. 1, a schematic of a plasma-enhanced chemical vapor deposition (PECVD) chamber 100 is presented. Input to the PECVD chamber 100 is one or more carbon precursor gases 102A. These carbon precursor gases include $CH_4$, $C_2H_2$, $C_2H_4$, or a combination thereof. Input to the PECVD chamber 100 also includes $H_2$ (102B) which is used as hydrogen plasma to reduce oxidation of the metal (discussed below). Input to the PECVD chamber 100 also includes a third input (102C) which is Ar in one instance to remove contaminant and being the carrier gas. In FIG. 1, hydrogen atoms are shown as small circles and carbon atoms are shown as large circles.

The PECVD chamber 100 includes a radiofrequency (RF) generation coil 104 configured to generate plasma. An RF generator (not shown) provide electromagnetic radiation suitable for forming a plasma from a plasma-forming gas. Frequency of electromagnetic radiation can range between about 10 MHz to about 30 GHz. The power of the RF generator (not shown) can be between about 200 and 600 Watts.

The PECVD chamber 100 of FIG. 1, also includes furnace elements 106 and a vacuum pump 108. The process of growing graphene is thus discussed below.

Figure 2:
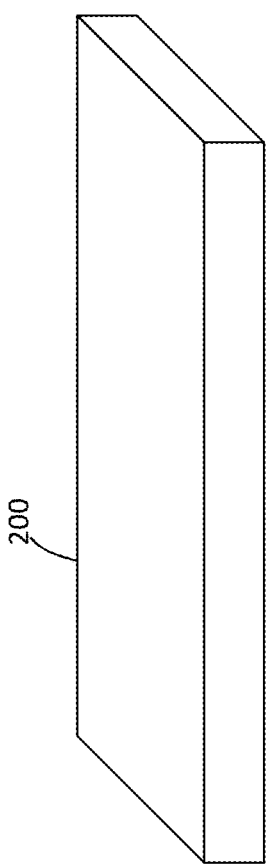
FIG. 2 is a perspective view of a dielectric substrate, according to the present disclosure.

Referring to FIG. 2, a perspective view of a dielectric substrate 200 is shown. The dielectric substrate 200 is first cleaned by a solvent. In one embodiment the solvent is a combination of toluene, acetone, and isopropyl alcohol (IPA). According to one embodiment the dielectric substrate 200 is washed with the solvent for 5 minutes. The dielectric substrate is made from Si, $SiO_2$, quartz, magnesium fluoride ($MgF_2$), calcium fluoride ($CaF_2$), aluminum fluoride ($AlF_3$), tantalum pentoxide ($Ta_2O_5$), hafnium oxide ($HfO_2$), oxidized zirconium ($ZrO_2$), yttrium oxide ($Y_2O_3$), oxidized scandium ($Sc_2O_3$), BN, $MoS_2$, $WSe_2$, $WS_2$, mica, glass, polymers, or plastics. After the dielectric substrate 200 has been washed, a layer of cobalt (Co) 304 is deposited on the washed substrate 302 as shown in the deposition process in FIG. 3. The cobalt layer can be synthesized using any one cobalt organic among dicobalt carbonyl [$Co_2(CO)_8$], cobalt acetylacetonate [$Co(CH_3COCHCOCH_3)_2$], bis cyclopentadienyl cobalt [$(C5H_5)_2Co$], cobalt tricarbonyl nitrosyl [$Co(CO)_3NO$], cyclopentadienyl cobalt dicarbonyl [$C_5H_5CO(CO)_2$], and tetracobalt dodecacarbonyl [$Co_4(CO)_{12}$], or the cobalt layer can be deposited using deposition techniques known to a person having ordinary skill in the art including physical vapor deposition and atomic layer deposition. Cobalt is deposited in a crystalline form. The thickness of the cobalt layer can range from about 1 nm to about 1 μm. Grain boundaries are defined as the spacing between clusters of crystalline structures of cobalt. The size of the grain in the layer of cobalt 304 is one key parameter in the present disclosure. Another key parameter is the spacing that exists in the cobalt crystalline structure such that carbon atoms can diffuse through the cobalt atom. However, the rate at which carbon atoms can diffuse based on this mechanism is slower than the rate where carbon atoms can diffuse between lattices (i.e., based on the grain boundaries of the cobalt layer). Various techniques can be used to deposit layers of cobalt 304 onto the substrate 302. Exemplary techniques include e-beam evaporation, known to a person having ordinary skill in the art. Using this technique, a layer of cobalt having a thickness of between about 5 nm to about 20 nm of cobalt, or from 6 nm to 18 nm, can be deposited at room temperature which is an amorphous layer (i.e., substantially zero grain boundaries, where substantially all of the diffused carbon is through the amorphous structure of cobalt). Using sputtering, also known to a person having ordinary skill in the art, a layer of cobalt having a thickness between about 5 nm to about 500 nm can be deposited with grain sizes ranging from about 1 nm to about 100 nm. The inventors of the present disclosure have identified carbon diffusivity through Co is greater than other metals disclosed in the prior art such as Ni, therefore it is easier for carbon atoms to diffuse through the Co and form continuous graphene film underneath. According to one embodiment the layer of cobalt 304 can be annealed to increase the grain size. The larger grain size can ultimately result in a thinner and better quality layer of graphene deposited on the dielectric substrate 302, as discussed below. The annealing process includes a rapid thermal annealing technique at a temperature of between about 350° C. and about 800° C. or thermal anneal in vacuum at the temperature of between about 350° C. and about 800° C. for 1-5 hours. Once the layer of cobalt 304 is deposited onto the dielectric substrate 302, the dielectric/Cobalt layer is placed in the Loadlock (not shown) of PECVD chamber 100.

According to one embodiment, description of graphene growth process is provided as follows: The sample is first placed in the Loadlock (not shown), then the Loadlock (not shown) and the PECVD chamber 100 are evacuated to 5 mtorr to 100 mtorr by activating the vacuum pump 108, and the PECVD chamber is heated up to the temperature between about 350° C. and about 800° C. When the temperature reaches the set value, a flow of Ar is injected and the pressure is stabilized to 5 mTorr to 600 mtorr, and the sample is loaded into the PECVD chamber 100. Then the plasma is generated to produce hydrogen and carbon radicals that are able to reduce CoOx and enable the subsequent graphene deposition. Power for generating plasma can be 200 watts to 600 watts. After graphene growth, the sample is unloaded to the Loadlock (not shown) from the PECVD chamber 100.

Figure 3:
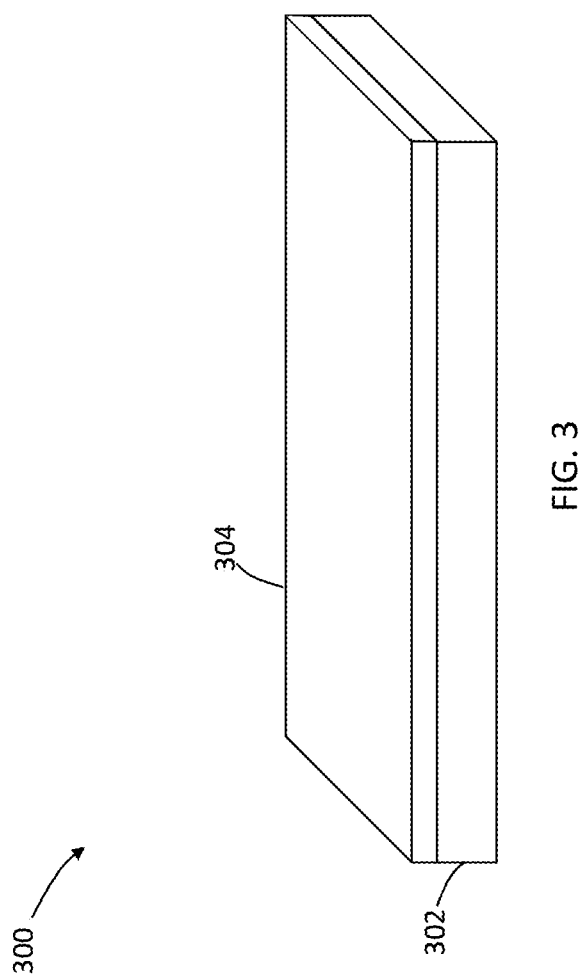
FIG. 3 is a perspective view of a substrate/cobalt layer, according to the present disclosure.
Figure 4:
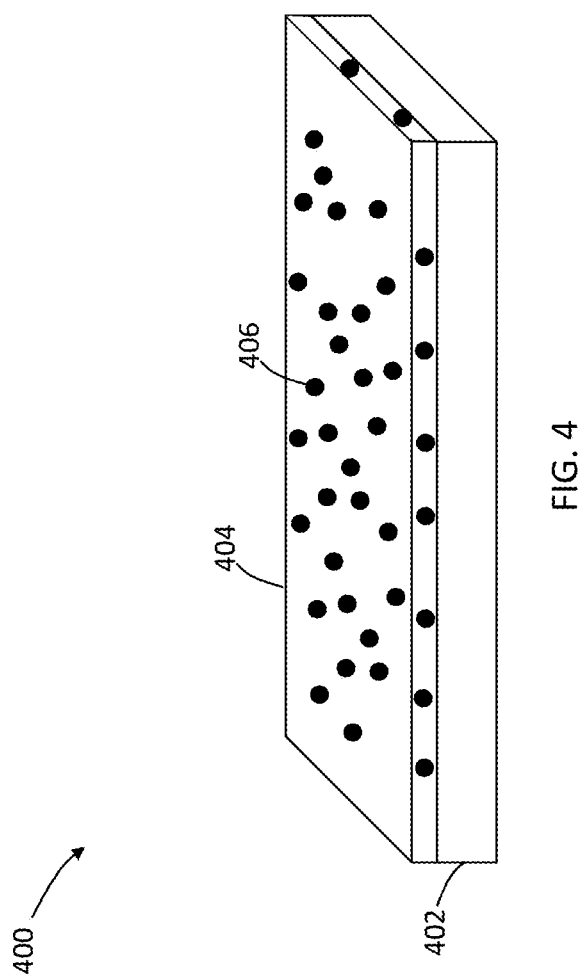
FIG. 4 is a perspective view of a substrate/cobalt/carbon atoms, according to the present disclosure.
Figure 5:
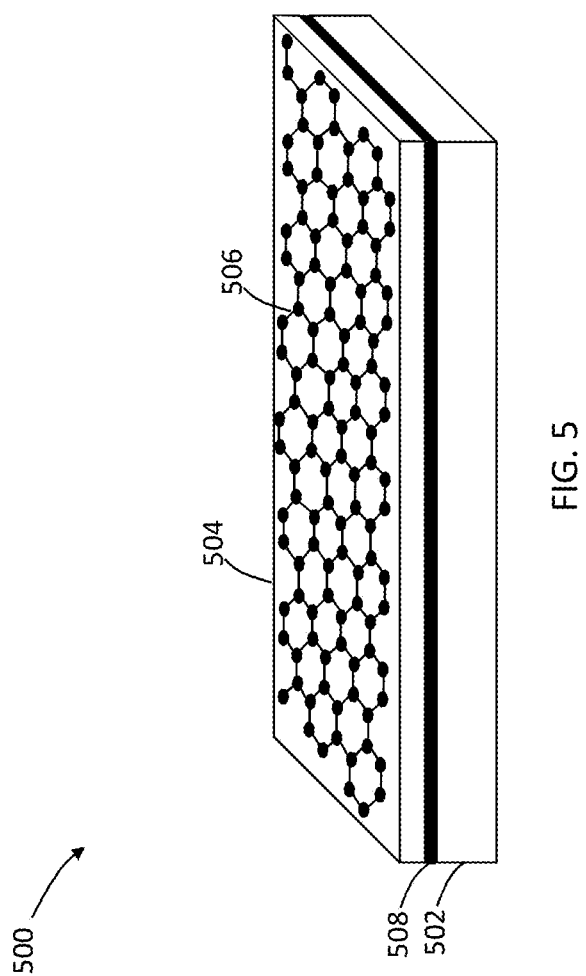
FIG. 5 is a perspective view of a combination according to the present disclosure including grown graphene on a substrate.

Referring to FIG. 3 a perspective view of a substrate/cobalt layer 300 is shown. As discussed above, hydrogen radicals in the plasma is used to reduce any oxidation of the cobalt layer 304. The plasma activation lasts between about 5 to 15 minutes to the substrate/cobalt 300 at the temperature between about 350° C. and 800° C. Prior to the reduction of oxidation has taken place, an ultra-low pressure is applied to the PECVD chamber 100 by activating the vacuum pump 108. The PECVD system used is a commercially available FIRST NANO EASYTUBE 3000 system, while the matchbox included in the plasma machine is PFM 1500A MATCHBOX. The PECVD chamber 100 may have a pressure as low as between about 5 mtorr to about 100 mtorr or may be within any range delimited by any pair of the foregoing values. Next a flow of methane ($CH_4$) or acetylene ($C_2H_2$), ethylene ($C_2H_4$), or a combination thereof, as the precursor gas 102B is provided into the PECVD chamber 100. As the precursor gas is provided, plasma is activated at the temperature between about 350° C. and about 800° C. to allow graphene atoms to be diffused into the cobalt between the grain boundary. During the growth, some carbon atoms are deposited on the Co top layer surface as shown in FIG. 4 where a substrate 402 and a cobalt layer 404 are shown with carbon atoms 406 dispersed and grown on the top layer forming the substrate/cobalt/carbon atoms 400 as shown in FIG. 4. As plasma is continued to be applied for between about 1 min and about 60 min, some carbon atoms form a lattice structure on the top of the layer of cobalt while some carbon atoms are diffused through the cobalt layer in between the grain boundaries to form a lattice layer of carbon atoms between the substrate and the layer of cobalt. This formation is shown in FIG. 5, where the substrate 502 is shown below the layer of cobalt 504, with a lattice of carbon atoms 506 (i.e., graphene) formed on top of the layer of cobalt with the layer of graphene 508 between the layer of cobalt 504 and the substrate 502 to generate the combination 500 shown in FIG. 5.

Following the deposition process, the sample is unloaded to Loadlock (not shown) to cool down for 30 min, then the Loadlock (not shown) and the chamber are vented to atmosphere to take the sample out. Alternatively, the PECVD chamber 100 can be purged with a noble gas, such as argon, or nitrogen, and vented to atmosphere. Purging with the noble gas or nitrogen may prevent contaminants, such as moisture, from entering the PECVD chamber 100 and contaminating the coating. As such Ar or other suitable gases known to a person having ordinary skill in the art (102C) is provided as input to the PECVD chamber 100 to remove unwanted contaminants. The vacuum pump 108 pumps out Ar that is provided as input.

Afterwards, the top layer of graphene 506 is removed by applying an etchant such as Reactive Ion Etch (RIE) at room temperature. PANASONIC RIE and PLASMA TECH RIE can be used to etch top graphene layer. Once the graphene layer is removed, the cobalt layer 504 is removed by etching using an etchant. The etchant can be iron(III) chloride $FeCl_3$, iron (III) sulfate $Fe_2(SO_4)_3$, iron(III) sulfamate $Fe(SO_3NH_2)_3$, iron mesylate $Fe(SO_3CH_3)_3$, copper (II) chloride $CuCl_2$, $KMnO_4$, copper sulfate $CuSO_4$ or any combination thereof.

Figure 6:
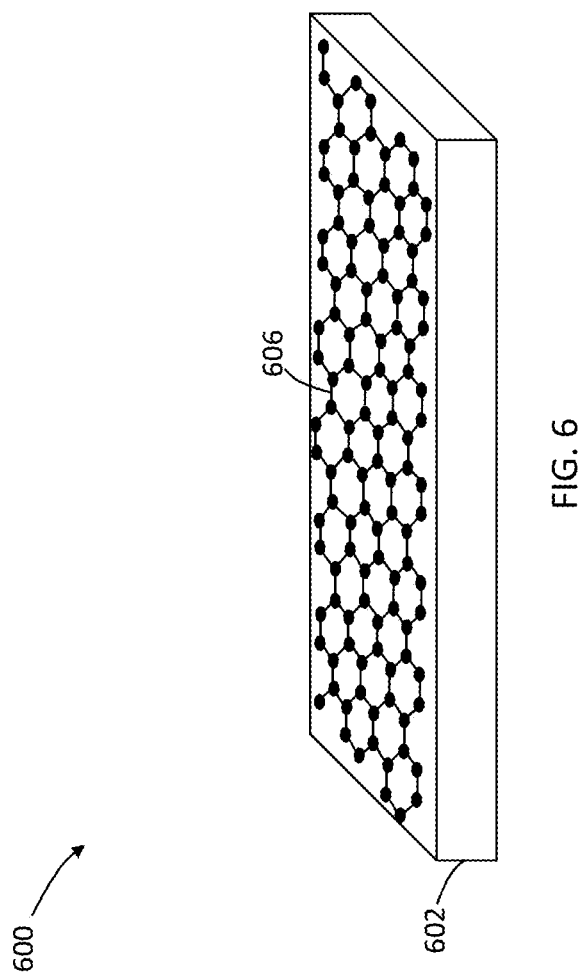
FIG. 6 is a perspective view of a substrate/graphene after etching of the top graphene and cobalt layer, according to the present disclosure.

With the layer of cobalt 504 removed, a combination of substrate/graphene 600 is remaining as shown in FIG. 6 which includes a substrate 602 and a layer of graphene 606 in the form of a lattice formed on top of the substrate. This combination of substrate and graphene 600 can be used for a variety of different semiconductor applications.

Referring back to FIG. 3, a layer of $Al_2O_3$ (about 1 to about 5 nm) (not shown) deposited on the top of Co 304 can be used to prevent Co from evaporation during the growth when the pressure is lower than about 300 mTorr and the thickness of Co is less than about 30 nm.

Figure 7:
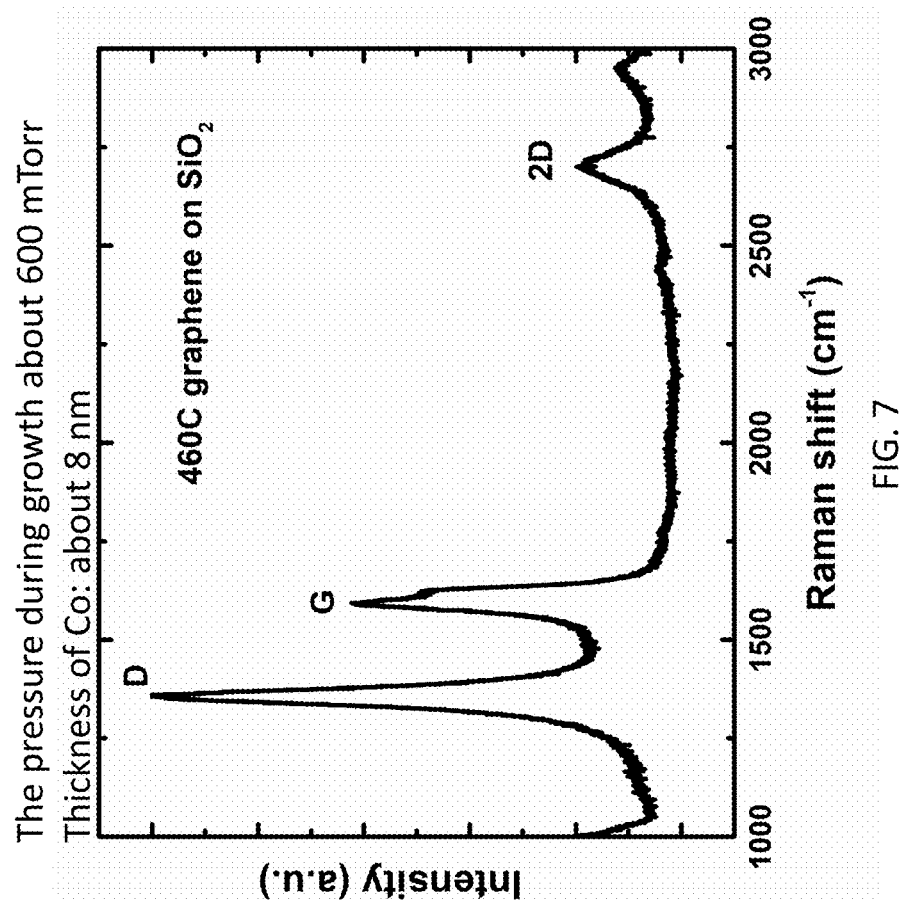
FIG. 7 is a graph of intensity vs. Raman shift to show evidence of graphene growth on $SiO_2$ at a first exemplary temperature (about 460° C.).
Figure 8:
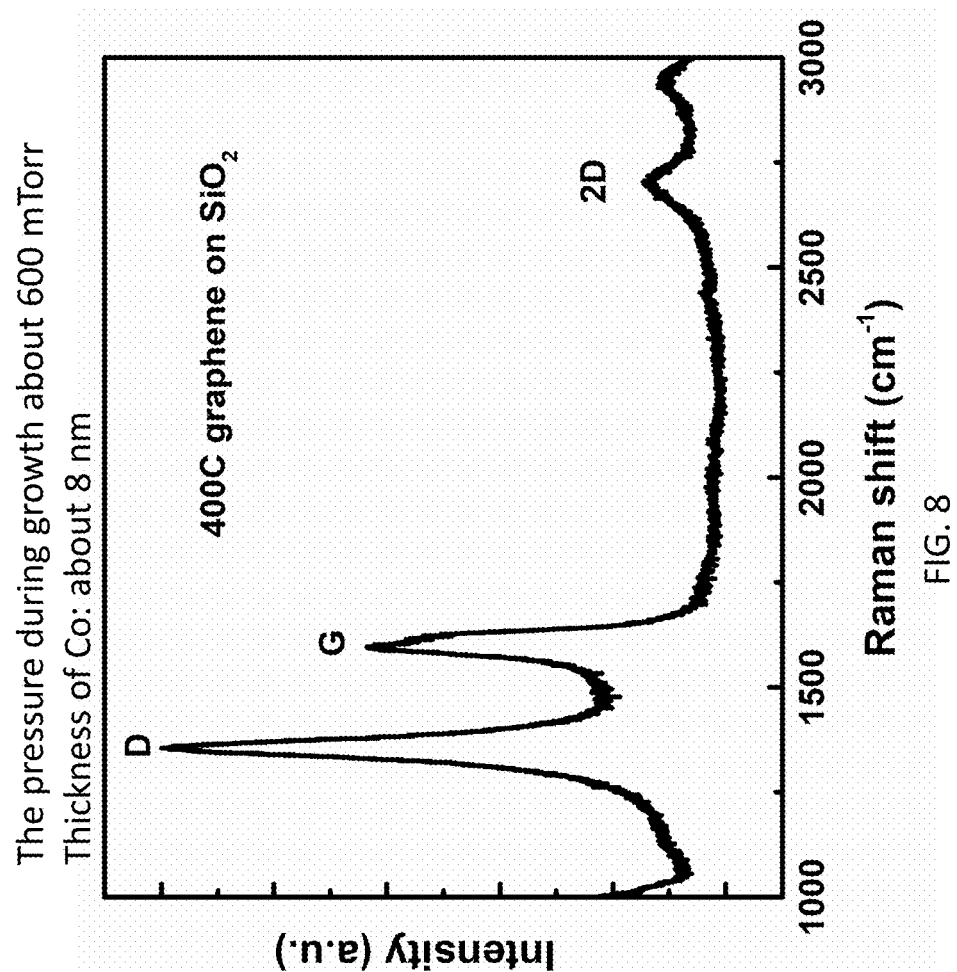
FIG. 8 is a graph of intensity vs. Raman shift to show evidence of graphene growth on $SiO_2$ at a second exemplary temperature (about 400° C.).

Referring to FIGS. 7 and 8, graphs of intensity vs. Raman shift are provided to show evidence of graphene growth on $SiO_2$ at different temperatures (460° C. and 400° C., respectively) as can be seen clearly from the graphs.

Figure 9:
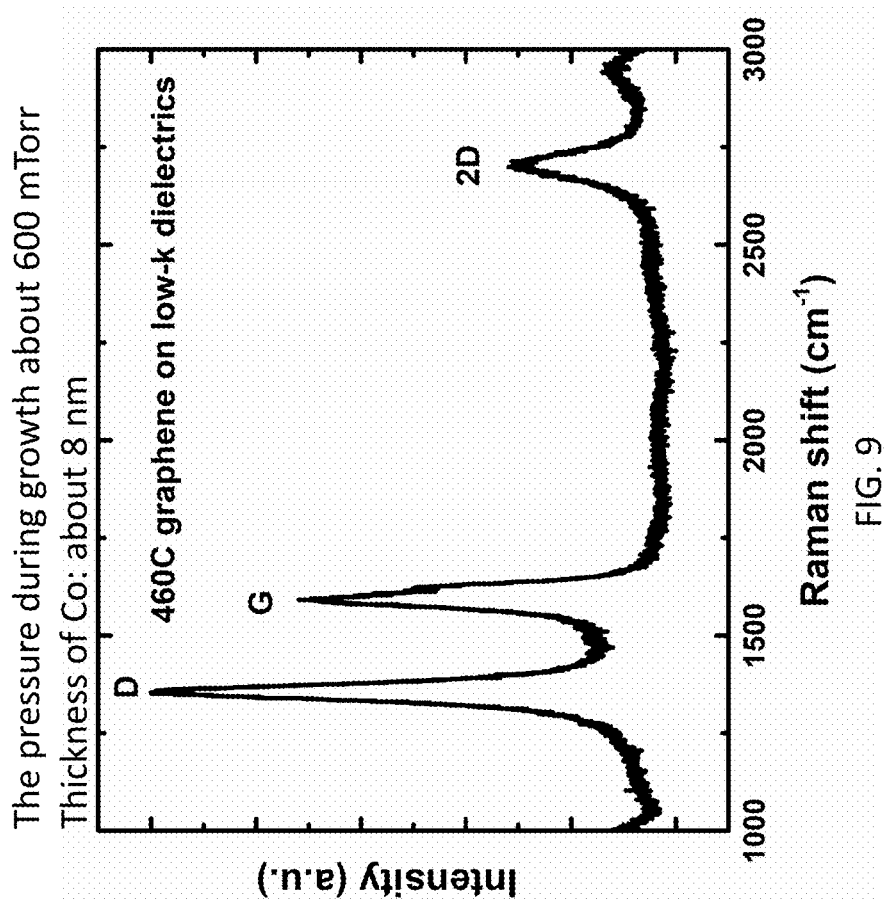
FIG. 9 is a graph of intensity vs. Raman shift to show evidence of graphene growth on low-k dielectric at an exemplary temperature of about 460° C.

Referring to FIG. 9, a graph of intensity vs. Raman shift is provided to show evidence of graphene growth on low-k dielectric at 460° C. as can be seen clearly from the graphs.

Figure 10:
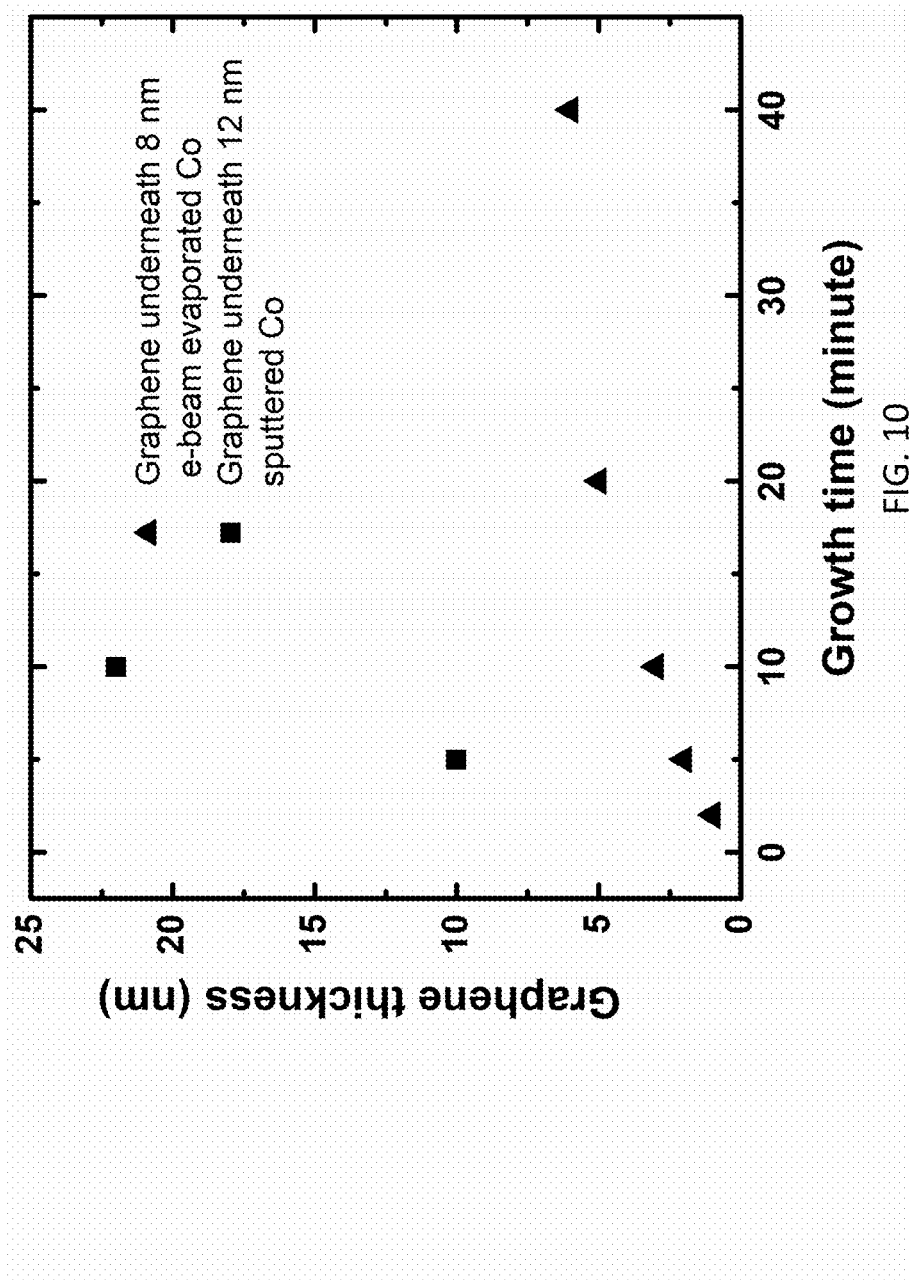
FIG. 10 is a graph of graphene growth rate (thickness in nm vs. time in minutes) for graphene growth on 8 nm cobalt deposited by E-beam evaporation vs. 12 nm cobalt deposited by sputtering.

Referring to FIG. 10, a graph of graphene growth rate (thickness in nm vs. time in minutes) is provided for graphene growth on 8 nm cobalt deposited by E-beam evaporation vs. 12 nm cobalt deposited by sputtering. As seen from the graph of FIG. 10, graphene growth is faster over the 8 nm cobalt deposited by E-beam evaporation vs. 12 nm cobalt deposited by sputtering.

Figure 11:
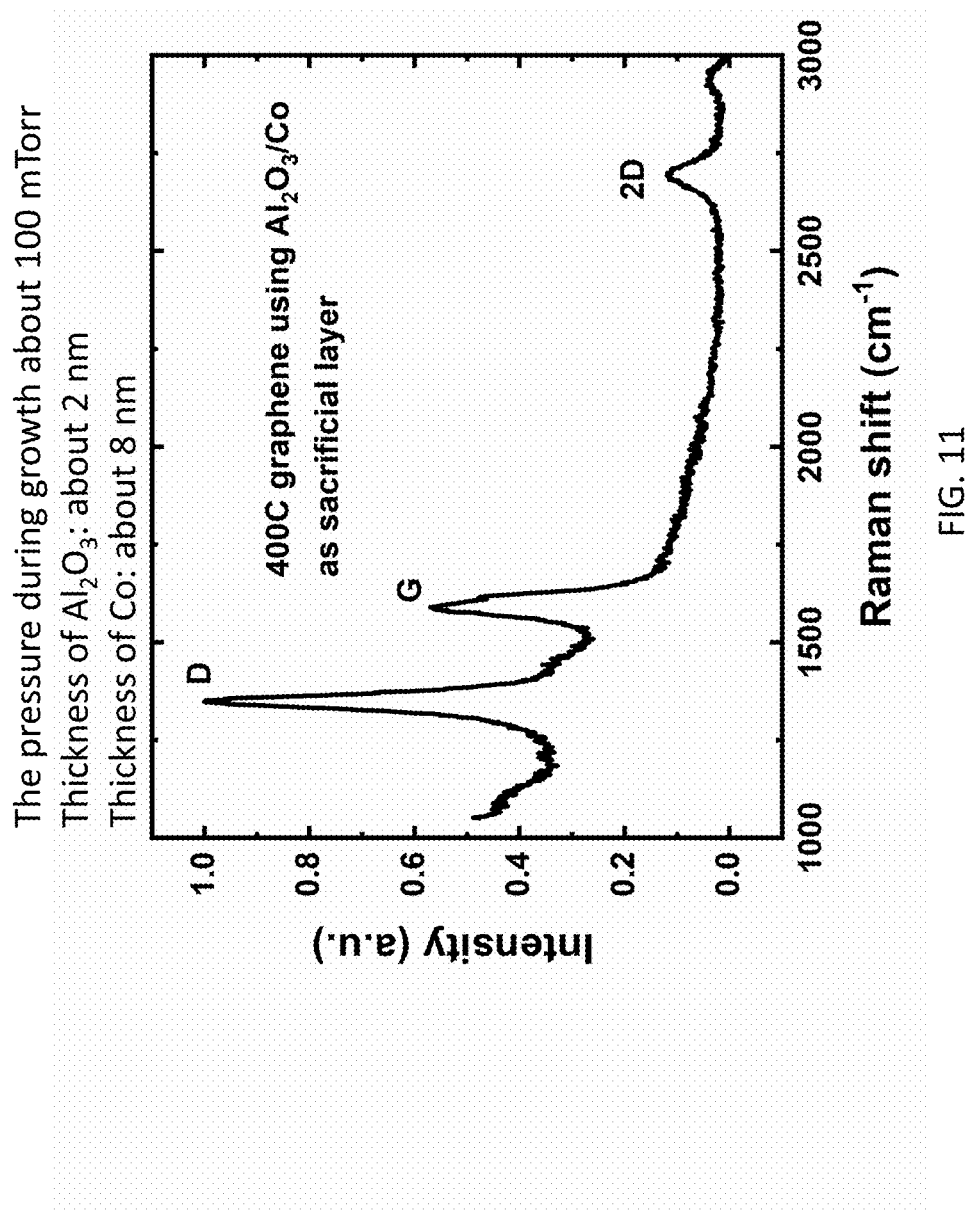
FIG. 11 is a graph of intensity vs. Raman shift to show evidence of graphene growth using $Al_2O_3$/Co as a sacrificial layer at a first exemplary temperature (about 400° C.).
Figure 12:
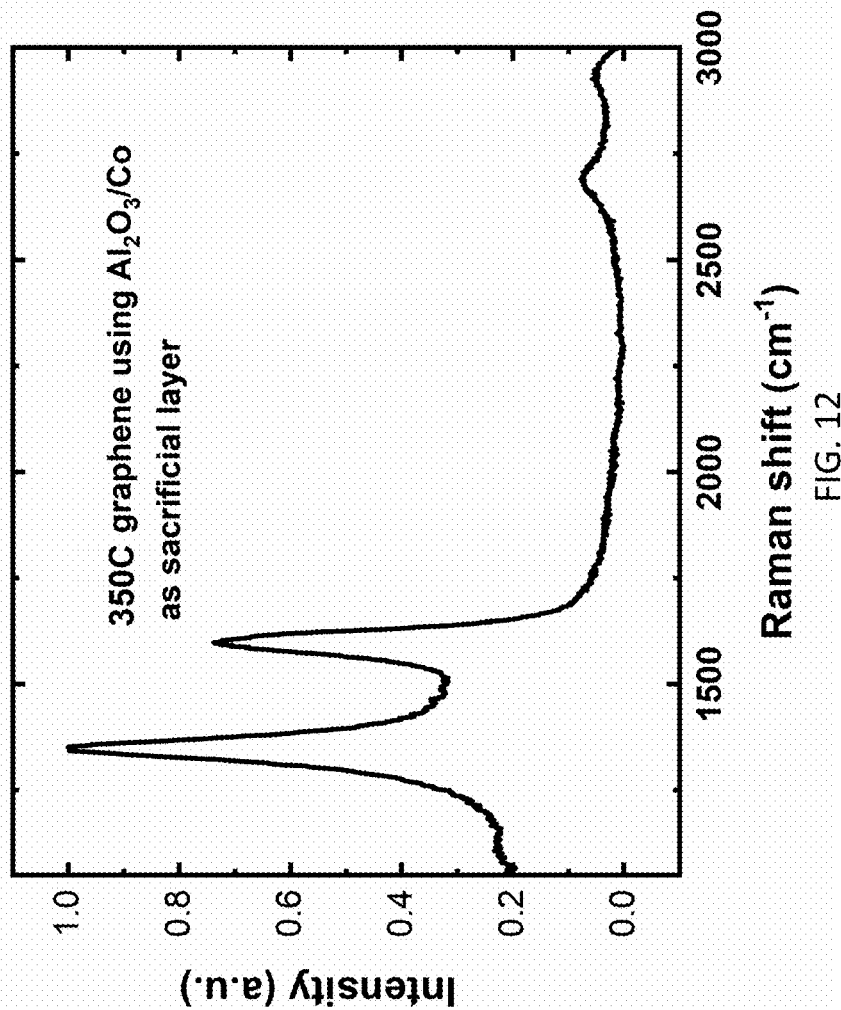
FIG. 12 is a graph of intensity vs. Raman shift to show evidence of graphene growth using $Al_2O_3$/Co as a sacrificial layer at a second exemplary temperature (about 350° C.).

Referring to FIG. 11 and FIG. 12, a graph of intensity vs. Raman shift is provided to show evidence of graphene growth on $SiO_2$ using $Al_2O_3$/Co at 400° C. and 350° C. as can be seen clearly from the graphs.

Those having ordinary skill in the art will recognize that numerous modifications can be made to the specific implementations described above. The implementations should not be limited to the particular limitations described. Other implementations may be possible.

The invention claimed is:

1. A method of low-temperature growing graphene on a substrate, comprising:

depositing a layer of cobalt on a substrate and placing the substrate with the layer of cobalt deposited thereon in a plasma enhanced chemical vapor deposition (PECVD) chamber;

providing a carbon precursor gas to the PECVD chamber;

generating plasma at between 315° C. and 385° C. to decompose the carbon precursor gas to thereby deposit carbon atoms on the cobalt layer, enabling a plurality of carbon atoms to diffuse through the cobalt layer thereby growing graphene on top of the cobalt layer and in between the substrate and the cobalt layer;

removing carbon atoms from top of the cobalt layer;

removing the cobalt layer; and wherein the layer of cobalt is annealed prior to placement in the PECVD chamber.

2. The method of claim 1, wherein the substrate is dielectric.

3. The method of claim 2, wherein the dielectric is made from one or more of Si, $SiO_2$, quartz, magnesium fluoride ($MgF_2$), calcium fluoride ($CaF_2$), aluminum fluoride ($AlF_3$), tantalum pentoxide ($Ta_2O_5$), hafnium oxide ($HfO_2$), oxidized zirconium ($ZrO_2$), yttrium oxide ($Y_2O_3$), oxidized scandium ($Sc_2O_3$), BN, $MoS_2$, $WSe_2$, $WS_2$, mica, glass, polymers, and plastics.

4. The method of claim 1, wherein the cobalt layer is deposited on the substrate using one or more of dicobalt carbonyl [$Co_2(CO)_8$], cobalt acetylacetonate [$Co(CH_3COCHCOCH_3)_2$], bis-cyclopentadienyl cobalt [$(C_5H_5)_2Co$], cobalt tricarbonyl nitrosyl [$Co(CO)_3NO$], cyclopentadienyl cobalt dicarbonyl [$C_5H_5Co(CO)_2$], and tetracobalt dodecacarbonyl [$Co_4(CO)_{12}$].

5. The method of claim 1, wherein the deposition process of the cobalt layer on the substrate includes physical vapor deposition.

6. The method of claim 5, wherein the process is sputtering.

7. The method of claim 6, wherein thickness of the cobalt layer ranges from about 5 nm to about 500 nm and the grain sizes range from about 1 nm to about 100 nm.

8. The method of claim 1, wherein the deposition process of the cobalt layer on the substrate includes e-beam evaporation.

9. The method of claim 8, wherein thickness of the cobalt layer ranges from about 5 nm to about 20 nm and the grain boundaries are substantially zero.

10. The method of claim 9, wherein thickness of the cobalt layer ranges from about 6 nm to about 18 nm.

11. The method of claim 1, wherein the annealing process includes rapid thermal annealing.

12. The method of claim 1, wherein the carbon precursor gas includes one or more of methane ($CH_4$), acetylene ($C_2H_2$), and ethylene ($C_2H_4$).

13. The method of claim 1, wherein the removing of carbon atoms from top of the cobalt layer includes etching at room temperature.

14. The method of claim 13, wherein the etching includes RIE.

15. The method of claim 1, wherein the removing of the cobalt layer includes etching.

16. The method of claim 15, wherein the etchant includes one or more of iron(III) chloride $FeCl_3$, iron (III) sulfate $Fe_2(SO_4)_3$, iron(III) sulfamate $Fe(SO_3NH_2)_3$, iron mesylate $Fe(SO_3CH_3)_3$, copper (II) chloride $CuCl_2$, $KMnO_4$, and copper sulfate $CuSO_4$.

* * * * *